(12) United States Patent
Rakib et al.

(10) Patent No.: US 6,466,564 B1
(45) Date of Patent: Oct. 15, 2002

(54) TWO DIMENSIONAL INTERLEAVE PROCESS FOR CDMA TRANSMISSIONS OF ONE DIMENSIONAL TIMESLOT DATA

(75) Inventors: Selim Shlomo Rakib, Cupertino; Zvi Bernstein, San Jose, both of CA (US)

(73) Assignee: Terayon Communications Systems, Inc., Santa Clara, CA (US)

( * ) Notice: Subject to any disclaimer, the term of this patent is extended or adjusted under 35 U.S.C. 154(b) by 0 days.

(21) Appl. No.: 09/152,643

(22) Filed: Sep. 14, 1998

(51) Int. Cl.[7] .............................................. H04B 7/216
(52) U.S. Cl. ...................................... 370/342; 370/335
(58) Field of Search ................................ 370/441, 431, 370/458, 342, 335, 336, 310, 347, 503, 464, 479, 478, 470, 330, 337; 375/356, 200, 354, 516, 292

(56) References Cited

U.S. PATENT DOCUMENTS 5,805,583 A * 9/1998 Rakib .......................... 370/342

\* cited by examiner

*Primary Examiner*—Douglas Olms
*Assistant Examiner*—Ricardo M. Pizarro
(74) *Attorney, Agent, or Firm*—Ronald Craig Fish

(57) ABSTRACT

A method and apparatus for interleaving symbols from a one dimensional TDMA 802.14 or MCNS minislot or other TDMA stream into two dimensional arrays in code and time for transmission on a code division multiplexed digital data transmission system. There are two methods disclosed. The first calculates i and j values for storage in RAM as a function of the symbol index in the TDMA stream, the number of codes to be employed, the column space design parameter representing the number of columns in the array, i.e., symbol times, that could be adversely affected by burst noise, and a calculated total number of columns in the array. The result is an array in which no indices of two symbols within any column or between columns of the column space are closer together than a design parameter vertical distance. The other method is similar but interleaves on both a column space as well as a row space so as to spread out the effects of both burst noise and intercode interference so that any errors that result are within the range of the redundant ECC bits to detect and correct.

12 Claims, 8 Drawing Sheets

RESULT OF METHOD 2

VERT_DIST = 3
COL_SPACE = 2
PACK_SIZE = 54
BSYM = 5

---

C = 7, R = 13
ROWSPACE = 3
HOR_DIST = 4

|  |  |  |  |  |  |  |
|---:|---:|---:|---:|---:|---:|---:|
| 1 | 40 | 79 | 27 | 66 | 14 | 53 |
| 36 | 75 | 23 | 62 | 10 | 49 | 88 |
| 71 | 19 | 58 | 6 | 45 | 84 | 32 |
| 15 | 54 | 2 | 41 | 80 | 28 | 67 |
| 50 | 89 | 37 | 76 | 24 | 63 | 11 |
| 85 | 33 | 72 | 20 | 59 | 7 | 46 |
| 29 | 68 | 16 | 55 | 3 | 42 | 81 |
| 64 | 12 | 51 | 90 | 38 | 77 | 25 |
| 8 | 47 | 86 | 34 | 73 | 21 | 60 |
| 43 | 82 | 30 | 69 | 17 | 56 | 4 |
| 78 | 26 | 65 | 13 | 52 | 91 | 39 |
| 22 | 61 | 9 | 48 | 87 | 35 | 74 |
| 57 | 5 | 44 | 83 | 31 | 70 | 18 |

FIG. 8

TWO DIMENSIONAL INTERLEAVE PROCESS FOR CDMA TRANSMISSIONS OF ONE DIMENSIONAL TIMESLOT DATA

FIELD OF USE

The invention is applicable to the field of digital data communications in general. In particular, it is useful to send CDMA multiplexed transmissions of data from timeslots of a time division multiplexed system.

The cable TV industry is evolving toward systems which can bidirectionally communicate digital data over the HFC in addition to one directional delivery of analog video signals over the same HFC media. This is useful for delivery of high speed internet access and telephone services to cable subscribers. These digital services are delivered by cable modems. Two closely related standards that are evolving for compatibility between cable modems are the 802.14 and MCNS standards with use time division multiplexing to provide multiple simultaneous access to the media for many subscribers. The assignee of the present invention has developed cable modems that are currently publicly available and which use synchronous code division multiple access (SCDMA) to provide simultaneous multiple access to the HFC media to multiple subscribers.

An emerging standard for use in digital multi-service delivery through TV distribution systems is MCNS. In this standard, MAC layer data frames are broken down into MPEG packets which are 64-QAM or 256-QAM modulated and sent downstream in a continuous stream after FEC encoding. The FEC encoding involves four layers of processing: the MPEG packets are broken up and encoded into Reed-Solomom blocks with block boundaries bearing no relationship to MPEG packet boundaries; an interleaver mixes up the resulting 7 bit symbols so symbols formerly contiguous in time are no longer contiguous; a randomizer that takes the output of the interleaver and scrambles the symbols in pseudorandom order; and a trellis encoder adds some redundant bits. There are no gaps in the downstream data in which the CU can send a barker code which carries the master chip clock and which signals frame boundaries. There are no downstream frame boundaries related to the MPEG packet frames, but there are FEC frames delineated by a 42 bit FEC sync trailer appended to the end of 60 R-S blocks for 64-QAM, each R-S block containing 128 7 bit symbols. There is a 28-bit unique sync pattern in the first 4 symbols of the trailer. The remaining 14 bits are utilized for interleaver control. The trailer is inserted by the R-S encoder and detected by the R-S decoder to locate FEC frame boundaries. There is no synchronization coupling between the FEC and transport layers where MPEG packets are processed.

The 802.14 standard uses minislots in a TDMA scheme to transmit data both upstream and downstream. The MCNS standard, like the 802.14 standard uses minislots and a TDMA scheme.

The present invention is undertaking an effort to develop a new generation of cable modems that are compatible with the minislot based TDMA schemes of 802.14 and MCNS compliant media access control (MAC) software layers at the central unit (CU) at the headend and at the subscriber sites (remote units or RUs). These cable modems will still use SCDMA technology for transmission over the media and will map symbols in minislots to various spreading codes and frames in a two dimensional code-time matrix.

A co-pending application assigned to the assignee of this invention entitled APPARATUS AND METHOD FOR SYNCHRONIZING AN SCDMA UPSTREAM OR ANY OTHER TYPE UPSTREAM TO AN MCNS DOWNSTREAM OR ANY OTHER TYPE DOWNSTREAM WITH A DIFFERENT CLOCK RATE THAN THE UPSTREAM, filed May. 6, 1998 Ser. No. 09/074,036 describes solutions to some of the problems of adapting SCDMA to MCNS or 802.14 minislot environments. The entire contents of patent application Ser. No. 09/074,036 are hereby incorporated by reference.

One problem with using such a two dimensional matrix for transmitting symbols from assigned minislots is burst interference. Suppose 8 symbols from a minislot to be transmitted upstream or downstream are placed in the matrix without interleaving in such a way that they are transmitted contiguous in time over a short interval. In this situation, if a short burst of interference that has a duration long enough to corrupt an appreciable number of the 8 symbols from the minislot, the loss of data can exceed the error detection and correction capability of the ECC bits added to the payload data thereby resulting in lost payload data. Likewise, because of imperfections in system timing in the SCDMA transmitters, if data from the same frame numbers transmitted by different RUs do not arrive at the CU exactly aligned in time (frame boundaries coincident in time at the CU for all frames transmitted by all RUs regardless of different path lengths for each RU), there will be interference between data transmitted on different adjacent orthogonal, cyclic codes. If this interference is large enough, payload data can be sufficiently corrupted to exceed the error detection and correction capability of the ECC bits.

Therefore, a need has arisen for a method and apparatus of interleaving symbols from minislots in both the time and code dimension so that symbols from the same minislot are not transmitted close enough in time to each other or on codes which are close enough in the cyclic code sequence to suffer from burst noise or intercode interference.

SUMMARY OF THE INVENTION

The teachings of the invention contemplate a genus of interleavers which are capable of interleaving a one dimensional array of sequential symbols to be transmitted in a code division multiplexed system into an interleaved two-dimensional array having one axis along the code dimension and the other axis along the time dimension. The first method of interleaving calculates i and j indices for use in generating RAM addresses for storing or reading symbols out of RAM with i calculated as a function of the index of the symbol to be stored and read and the number of codes allocated, i.e., the number of rows in the matrix. Index j is calculated as a function of the design factor Col_Space which is equal to an integer number of sequential columns that might be affected by burst noise. The resulting i and j indices cause the sequentially received symbols to be interleaved in such a manner that no two symbols in a pair from any column of between columns within an adjacent number of columns are closer together in time by a number of indices, i.e., symbol transmission times, that is less than a design parameter vertical distance, d.

The second method of interleaving interleaves in both design parameter Col_Space and a calculated parameter ROWSPACE which is the integer number of adjacent rows or codes in the array that could be adversely affected by intercode interference caused by frame alignment or other imperfections in the system. Again, indices i and j are calculated from which RAM addresses are generated. Index i is calculated as a function of the ROWSPACE, the symbol index n and the number of codes calculated for use in method 2. The index j is calculated as a function of the Col_Space, the symbol index n and the number of columns in the array. The result is an interleaved array wherein no two symbol indices anywhere in a number of adjacent columns defined by Col_Space are closer together than vertical distance, d, and no two symbol indices anywhere in a number of adjacent rows defined by ROWSPACE are closer together than HOR_DIST, a design parameter which is given to the interleaver.

BRIEF DESCRIPTION OF THE DRAWINGS

FIG. 8 is an interleaved array resulting from method 2.

DETAILED DESCRIPTION OF THE PREFERRED AND ALTERNATIVE EMBODIMENTS

Figure 1:
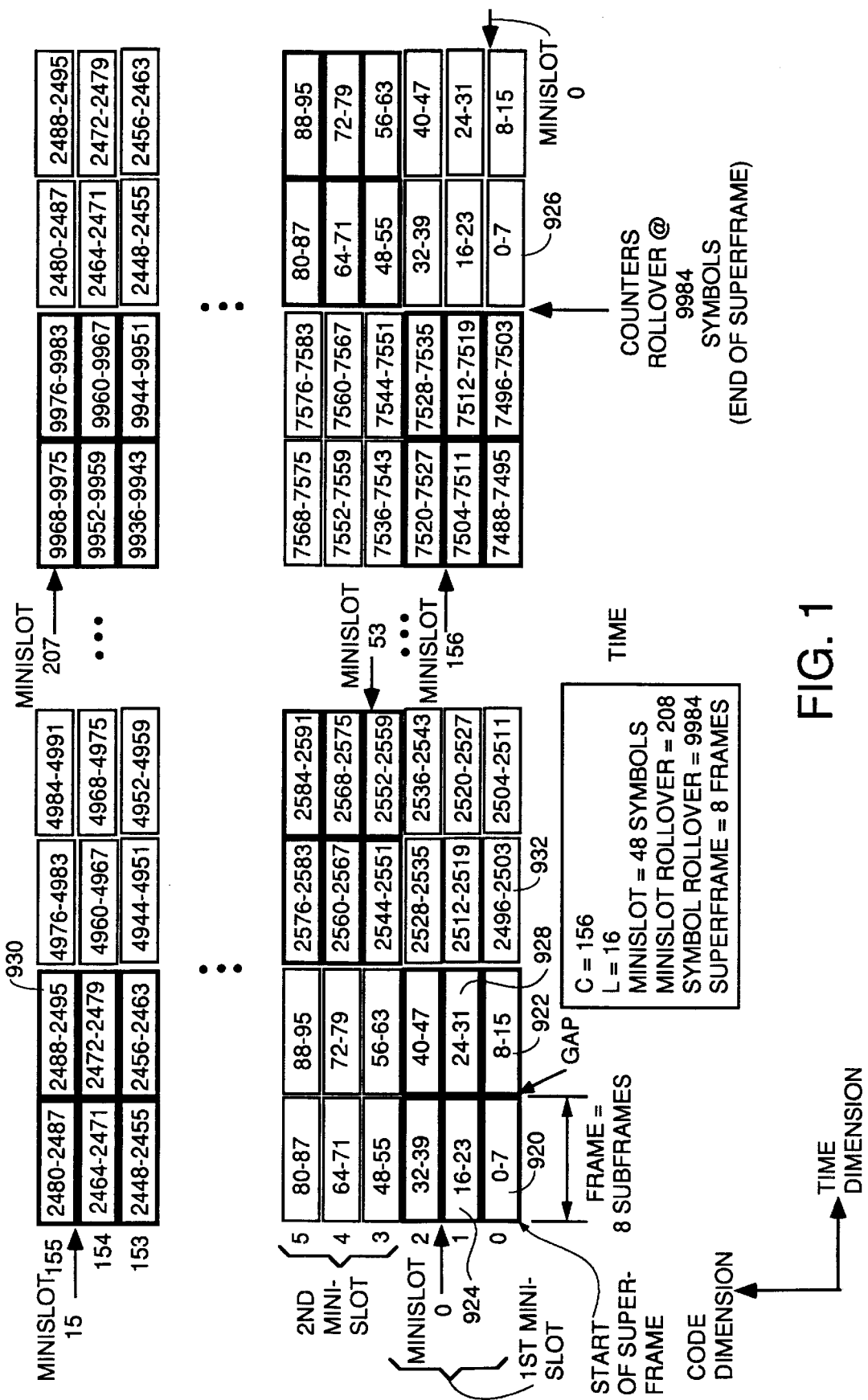
FIG. 1 is a diagram of one form of noninterleaved mapping of symbols from a linear array of minislots to a two dimensional array in codes and time.

This application incorporates by reference the teachings of PCT Publication WO97/08861, published Mar. 6, 1997 for details of SCDMA transmitters and receivers, and incorporates by reference the teachings of PCT publication WO97/34421, published Sep. 18, 1997 for apparatus and methods of using SCDMA on hybrid fiber coax plants to use ATM cells for data transfer. Also incorporated by reference herein are the IEEE 802.14 and MCNS published standards.

In 802.14 and MCNS systems, RUs are usually assigned block of minislots for upstream transmission by the media access control software layer in the CU by downstream management and control messages. Upstream data is organized in the form of APDUs as defined in the IEEE 802.14 specification. An APDU is an ATM protocol data unit. Basically it is a 54 to 74 byte (depending upon whether Reed-Solomon encoding is turned on or off) packet of data and is the standard way 802.14 MAC layer processes expect to give data to the physical layer circuitry. When a block of upstream minislots is assigned to an RU, it will take any APDUs it has to send and break them down into an integer number of minislots. Because SCDMA transmitters include ranging circuitry to very precisely align RU minislot boundaries in time with CU minislot boundaries, achieving an integer number of minislots for each SPDU is easier since the programmable size guardband of the first minislot of each block can be set to 0 bytes.

In order to use SCDMA techniques in this minislot oriented environment, it is necessary to map SCDMA frames to minislots. A typical SCDMA frame structure will have 8 subframes and a gap in each frame used for ranging to achieve frame synchronization. 802.14 and MCNS systems use 8-bit bytes so with an 8-byte frame, no matter how many bits are transmitted with each subframe, the result will always be an integer number of bytes that will have been transmitted in those 8 subframes. If there are C codes in the codebook, each subframe will be comprised of C symbols. In an SCDMA system, during one baud or symbol time, C symbols will be simultaneously transmitted by various RUs on different assigned codes so they do not interfere with each other.

If the codebook has 156 codes, each code with 156 elements, and each code is one row in a two dimensional CDMA spreading code matrix, the matrix will have 156 columns with each row element in a particular column being one element in one code. Each code is therefore a 1×156 vector which defines one row in the CDMA spreading code matrix. Each subframe is a 1×156 vector where a 156 code codebook is in use with each element being a symbol comprised of some number of bits depending upon the modulation type in use. 16-QAM translates to 4 bits per symbol. To transmit that subframe using an SCDMA transmitter, the 1×156 subframe vector (also referred to as an information vector) is matrix multiplied by the spreading code matrix to yield a 1×156 result vector having 156 chips, each chip being the sum of 156 partial products. That result vector is transmitted during that subframe's time of the SCDMA frame.

Typically, code assignment to minislot mappings will be fixed and known to both the CU and RUs so when a block of minislots are assigned to an RU, it knows which codes to use to transmit data from those minislots.

FIG. 1 shows a typical minislot to code and frame mapping. FIG. 1 only illustrates one example of a programmable mapping between assigned minislot numbers and the symbols and codes which will be transmitted by the RU receiving the minislot assignment. The 802.14 and MCNS CU MAC and terminal control (TC) layers, if conventional, only understand minislots in the upstream and have no provisions to understand or reassemble HS-CDMA frames. The TC layer of a 802.14 or MCNS CU compliant CU and RU modem supplied by the assignee of this invention is modified to understand ranging and barker codes in gaps in HS-CDMA frames and to understand a programmable mapping from HS-CDMA frames, subframes, symbols and codes to minislots. This mapping will be rendered transparent to the CU MAC layer and RU MAC layer by the CU and RU TC layer processes.

In this mapping, each minislot has a number, and the CU and RU TC or MAC layers have the ability to keep track of each minislot number. When an RU receives upstream data to transmit, it sends an upstream management and control message to the headend controller saying "I have upstream traffic for you". This is called an access request. Since the headend controller has no idea when the RU will send these access requests, it assigns a subset of the minislots for this purpose. These minislots are often referred to as contention minislots, since multiple RUs could send access requests in the same minislot and thus contend with one another or collide. The RUs have contention resolution algorithms which are similar to the ranging contention resolution algorithm described in the PCT publications for this purpose.

The headend controller responds to an access request with a downstream management and control message awarding an integer number of specific minislots to the RU. The downstream message passes unchanged through the CU TC layer and arrives at the RU MAC layer processes of all RUs. The specific RU to which the message is directed recognizes the address and sends a command to the RU's TC layer process telling it to transmit on the assigned minislot(s).

FIG. 1 shows how minislots are mapped to specific symbol numbers and specific codes. Each frame is represented by a box of which boxes 920, 922 and 924 are typical. Each frame has the symbol numbers which are transmitted during that frame written inside it. Each symbol, depending on its data content, is mapped to one constellation point of the constellation of the specific modulation type in use, e.g., QPSK, 16-QAM, etc.

There are two dimensions to the matrix mapping symbols from minislots to codes and frames of the SCDMA physical layer. They are the code dimension along the vertical axis and the time dimension along the horizontal axis. The numbers along the vertical axis are the code IDs for the codes in the codebook.

Some of the frames in FIG. 1 have bold boundaries such as the frames that comprise minislot 0 during which symbols 0 through 47 will be transmitted. Symbols 1–47 comprise the entire 48 symbols of data content of minislot 0. Note that, assuming symbols 0–7 are contiguous in time in minislot 0, the mapping shown in FIG. 1 has consecutive symbols in time in the minislot raw data input transmitted consecutively in time on code 0 in the SCDMA code domain on the physical layer. If a short burst of interference occurs on the media during frame 920, all of symbols 0–7 in frame 920 and the rest of the symbols in the first column of the matrix may be wiped out. That is, symbols 16–23 on code 1 of frame 924, symbols 32–39, 48–55, 64–71 etc. can all be wiped out. If there are insufficient ECC bits added to detect and correct for a loss of 8 symbols, the payload data in each of these groups of 8 symbols will be lost.

Likewise, if imperfect synchronization in the SCDMA physical layer results in interference between data transmitted on code 0 versus code 1, it is possible for the symbols 0–7 of frame 920 spread by code 0 to be lost from interference from symbols 16–23 spread on code 1 or vice versa or for both sets of symbols to be lost from mutual interference. Other symbols or groups of contiguous symbols transmitted on contiguous, cyclic codes are also likely to be lost if the codes are interfering with each other.

Each frame has 8 subframes (not shown) with a gap between frames. Each subframe has C symbols in it (not shown) with C equal to the number of codes in the codebook (not shown), which in the example given, is 156. In the particular example given, the symbol to minislot mapping requires 48 symbols to be transmitted during every minislot (with "symbols" being the new definition and corresponding to one element of an information vector and not the entire information vector or result vector under the old definition in the PCT publications). The minislot counters in the CU and RU rollover at a count of 208 in the example of FIG. 1. Each of the CU and RU have symbol counters that reset at the minislot boundary and which rollover at a count of 9984 (208×48) simultaneously when the minislot counter rolls over at 208. Frame 926 represents the first frame after the rollover of the symbol and minislot counter at 9984 and 208, respectively. Frame 926 is the first frame in minislot 0 of the next group of 208 minislots.

There is a superframe construct in the SCDMA upstream which is defined as 8 SCDMA frames. The boundary of the superframe is marked by simultaneous rollover of the minislot and symbol counters.

Ranging is the process of establishing an offset in each RU such that if a pulse were transmitted exactly at the superframe boundary in the RU, it would arrive at the CU exactly at the corresponding superframe boundary in the CU.

Each RU can be assigned anywhere from 1 to C codes upon which it may transmit during a single subframe. This code assignment is made indirectly by the headend controller (HC also called CU herein) by assignment of minislots to that RU since the minislot numbers map to specific codes as well as specific symbol numbers (before interleaving).

Assigned minislot numbers are mapped to symbol numbers (before interleaving) and code number as follows. Starting at the superframe boundary or the beginning of minislot 0 which corresponds to beginning of frame 0, symbols are numbered on the first code along the time dimension until the programmable value L (16 symbols in the example given) is reached. Assume that after interleaving, symbol 0 is assigned to be spread by code 0. Since only code 0 is being used to spread this symbol, the result vector would have 156 elements therein each of which will be the product of symbol 0 times a code element which corresponds in index to the index of the result vector element. Thus, if symbol 0 has value X, and the individual code elements of code 0 have content symbolized by the numbers 1, 2, . . . C etc., then the result vector elements will elements X*1, X*2, X*3 . . . X*C. That first result vector will, assuming trellis modulation is turned off, will be transmitted during the first subframe of frame 1.

Symbol 1 would also be spread by code 0 (absent the interleaving process of the invention) because we have not yet reached L (symbol 15), so its result vector will be transmitted as the second subframe of frame 920. If symbol 1 has content Y, then the result vector transmitted as the second subframe in frame 0 will have elements Y*1, Y*2 . . . Y*C. Since there are only 8 subframes per frame, only eight symbols (symbols 0–7) will be transmitted during the first frame or frame 0 shown at 920. Since L is 16, the next eight symbols (symbols 8–15) will be transmitted during the 8 subframes of the second frame (frame 1 shown at 922). Once L is reached, we continue mapping symbol numbers to minislots and codes by resetting L to zero, returning to the beginning of the minislot being mapped and starting numbering symbols again on the next code up the code dimension. In the example given, this means symbols 16 through 23 are mapped to the frame shown at 924 on code 1. Each time a symbol is assigned to a frame and subframe and code, L is incremented. This process continues until L reaches 16 again by mapping symbols 24 through 31 to the frame shown at 928. This process is repeated for all codes. Once all codes for L symbols along the time axis have been mapped, we go back to the first code (code 0) and increment along the time axis to frames that have not yet been mapped and start again. For example, after symbol 2495 has been mapped to the last subframe of the frame shown at 930 on code 156, symbol 2496 is mapped to the first subframe of the frame shown at 932 on code 0. This process is repeated until all 9984 symbols and 156 codes in the superframe have been mapped to specific minislots. Then the process starts again at the rollover of the minislot and symbol counters in the CU and RU such that a new symbol 0 will be mapped to the new minislot 0 which starts with the frame shown at 926 on code 0. Note that this is a mapping example that does not do any interleaving along the time dimension but there is interleaving along the code dimension. As such, this mapping is susceptible to burst noise interference.

Figure 2A:
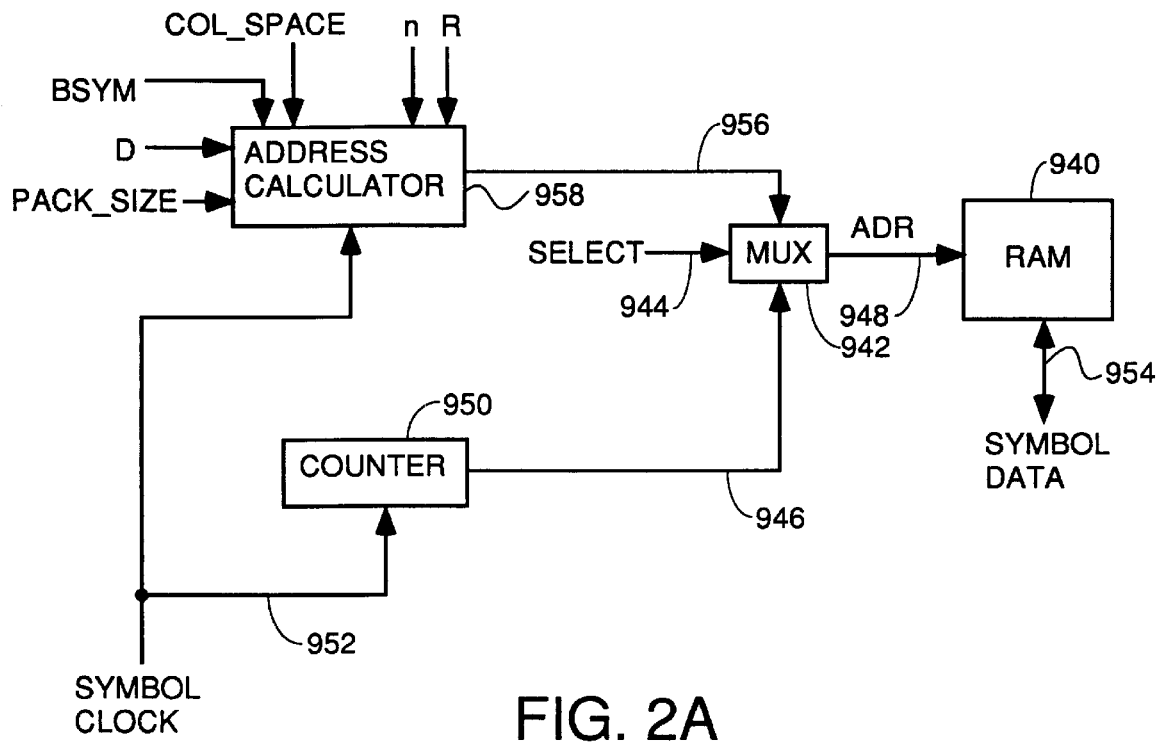
FIG. 2A is a block diagram of one form of interleaver apparatus that can store symbols in RAM in an interleaved fashion in accordance with either method 1 or method 2 in a system where the number of codes awarded to an RU is always the same.
Figure 2B:
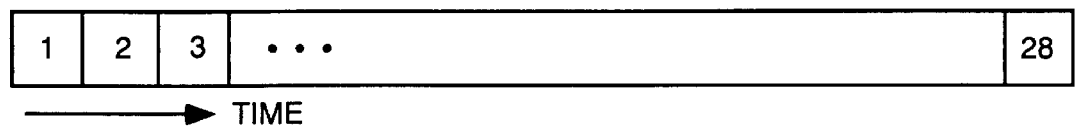
FIG. 2B is a diagram of a typical one dimensional minislot having 28 symbols.

FIG. 2A is a block diagram of one embodiment for an interleaver according to the teachings of the invention which is capable of performing either of the two interleaving methods described below to eliminate or minimize errors caused by burst noise and intercode interference. FIG. 2B is a diagram of a typical minislot that will be used to illustrate the operation of the interleaver of FIG. 2A and which will be the source of the raw symbol data used in the examples of interleaving methods 1 and 2 described below. The minislot of FIG. 2B has 28 symbols, although minislots in the 802.14 and MCNS standards may have other integer numbers of symbols. Each symbol will be an integer number of bits depending upon the modulation type in use. For example, trellis coded 16-QAM modulation results in 4-bit symbols. 32-QAM trellis coded modulation results in 5-bit symbols. 64-QAM trellis coded modulation results in 6-bit symbols. Each symbol is stored in one symbol position having an index within the minislot. Symbol 1 is stored in index position 1, and symbol 2 is stored in index position 2 and so on. The minislot is one dimensional in time only. To transmit the data in this minislot using an SCDMA system, the symbols of the minislot will be mapped both to time and different spreading codes as shown in FIG. 1.

Figure 3:
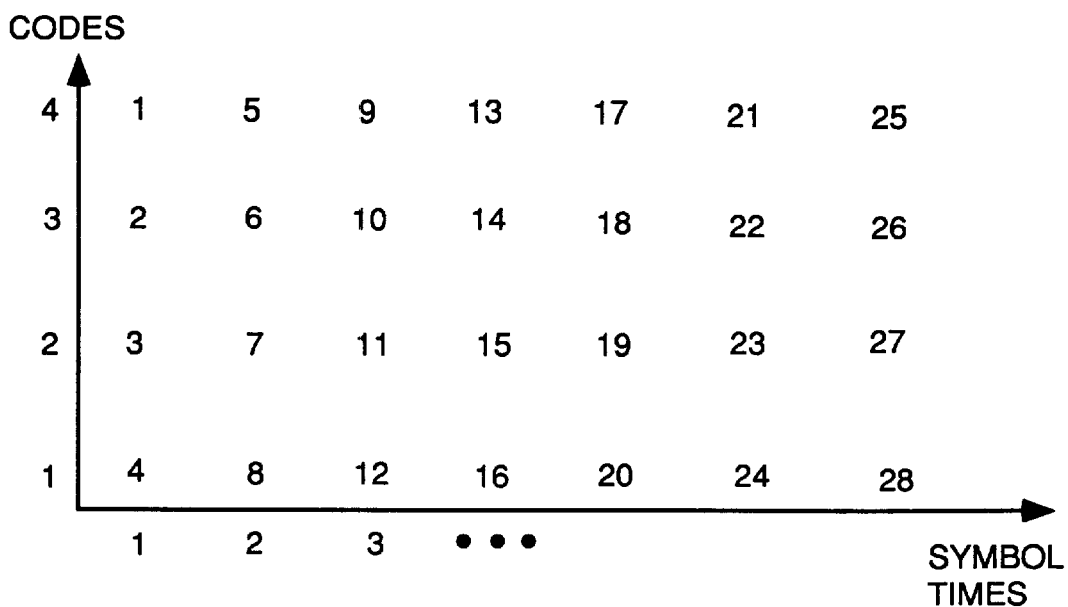
FIG. 3 is a diagram of a noninterleaved array of 28 symbols from the minislot of FIG. 2B.

One way of using the interleaver of FIG. 2A is to store symbols sequentially in RAM 940 and read them out in interleaved fashion. Another way of using the interleaver of FIG. 2A is to store the symbols in RAM in interleaved fashion and read them out for transmission sequentially. To store symbol data sequentially, multiplexer 942 is commanded by select control signal on line 944 to select the counter output on line 946 as the address input to supply to the address bus input 948 of RAM 940. A counter 950 counts out storage addresses sequentially with cycles of a symbol clock 952. Symbols are presented on data input 954 at the rate of one symbol per symbol clock period and are stored sequentially in RAM 940 in an array as shown in FIG. 3. FIG. 3 shows the resulting array of sequentially stored symbols in RAM.

To transmit this sequentially stored array (only advisable if no burst noise and no intercode interference was present), the array would have to be mapped to a code-symbol time space as shown in FIG. 3 with the vertical axis representing codes and the horizontal axis representing symbol times. To transmit, transmit addressing circuitry, not shown, would either count out 4 addresses during each symbol time or each memory storage location would be 4 symbols wide and data bus 954 would be 4 symbols wide, and the address generation circuitry would count out 1 read address for each symbol transmit time which would result in four symbols of one column being output simultaneously on the 4-symbol wide data bus during each symbol time. Thus, on the first symbol time, symbols 1, 2, 3 and 4 would be simultaneously output on bus 954 and parsed out by the transmitter for spreading on codes 1, 2, 3 and 4. These 4 symbols would then be simultaneously transmitted during the first symbol time. During the second symbol time, symbols 5, 6, 7 and 8 would be simultaneously output and simultaneously transmitted with spreading codes 1, 2, 3 and 4 again providing the necessary multiplexing on the shared channel.

Of course, the above described arrangement for outputting multiple symbols from RAM 940 during every symbol time works well in systems wherein every RU knows that it will get a code assignment of 4 codes. Likewise, the concept can be easily extended to any other fixed number of codes in each code assignment to each RU. Such fixed code assignment systems are less complex and useful in some applications.

However, in systems where the code assignments to each RU can vary depending upon traffic levels, a different approach is necessary. If the code assignment can vary between 0 and the maximum number of available codes, it is still necessary to read the number of symbols in each column from RAM 940 during each symbol time where the number of rows in each column is equal to the number of codes assigned. One way of doing this is to use a data bus 954 which is one symbol wide and use a much faster programmable clock to generate the addresses from which the symbols are to be read. This type arrangement is symbolized by FIG. 7. In this arrangement during storage of the symbols on one-symbol-wide data bus 954, the address calculator circuit 958 uses the parameters from the appropriate inputs to calculate i and j values for every symbol index and stores the sequentially supplied symbols on bus 954 in RAM 940 at addresses generated from the i and j values to get an interleaved array such as that shown by way of example in FIG. 4.

Figure 4:
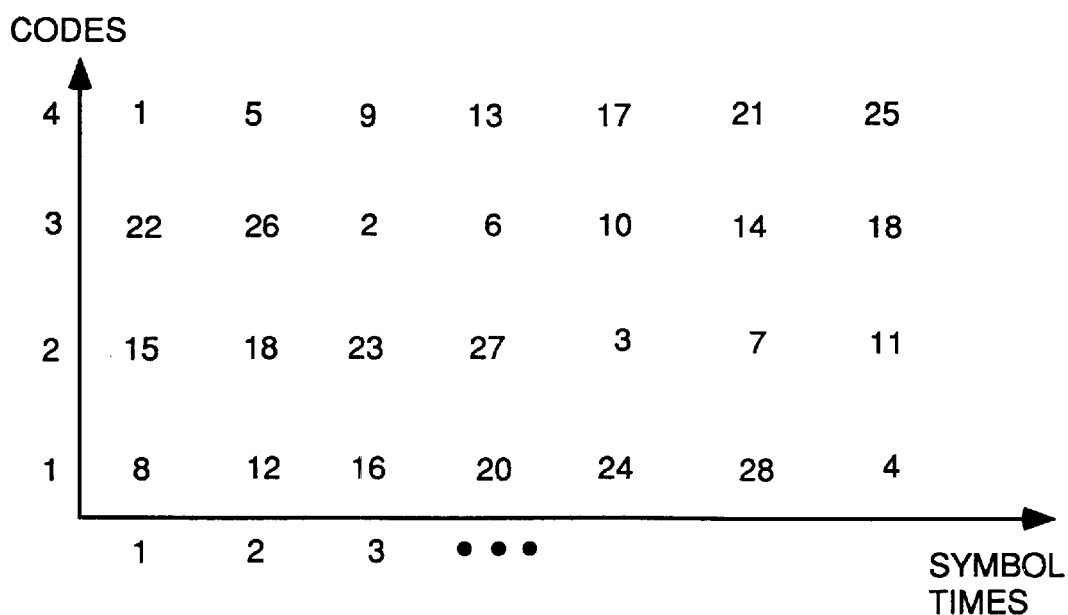
FIG. 4 is a diagram of an interleaved array having R=4, D=3 and Col_Space=2 resulting from calculation of RAM addresses using method 1.
Figure 7:
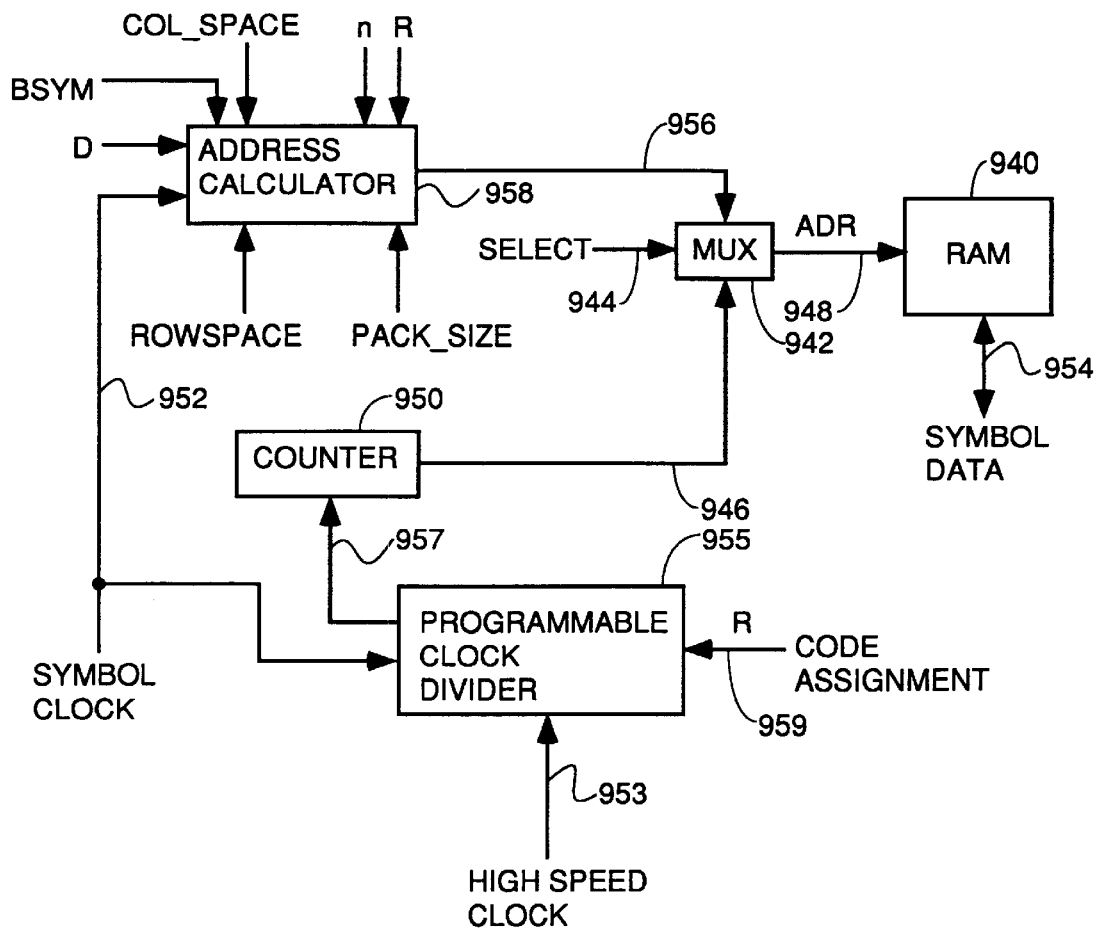
FIG. 7 is a block diagram of one embodiment of an interleaving apparatus useful in applications of a CDMA system wherein the number of assigned codes to each RU is variable.

In the apparatus of FIG. 7, apparatus and signals having the same reference numbers as apparatus in FIG. 2A have the same structure and perform the same function. In FIG. 7, the interleaved array of FIG. 4 is prepared before it is time to transmit the symbols in the array or concurrently therewith if adequate time to do the processing is available. To create the array of FIG. 4, address calculator 958 uses the appropriate inputs from the inputs shown in FIG. 7 to calculate the RAM addresses in accordance with either method 1 or method 2 for storage of the symbols in RAM 940 in an interleaved fashion, one symbol per period of symbol clock on line 952.

To transmit the symbols in the already interleaved array of FIG. 4 in a CDMA system, an entire column of symbols must be read out during every symbol time. In a system where the number of codes R in the code assignment can vary from frame to frame, a high speed clock 953 that is much faster than the symbol clock on line 952 is used to drive a programmable clock divider 955. The programmable clock divider, typically a phase lock loop, receives an integer number R as an input on line 959 where R corresponds to the number of codes assigned to the transmitter for transmitting the symbol data and defining the number of rows of the array. The factor R is used to divide down the high speed clock on line 953 phase coherently with the symbol clock signal on line 952 such that the clock output of the programmable divider on line 957 has a number of clock periods per every period of the symbol clock signal which equals the number of rows in each column of the array. This causes counter 950 to output addresses on bus 946 which are applied to bus 948 through multiplexer 942 during transmission such that an entire column of symbols are read out from during every symbol time and presented as a serial data stream on the one symbol wide data bus 954.

Figure 9:
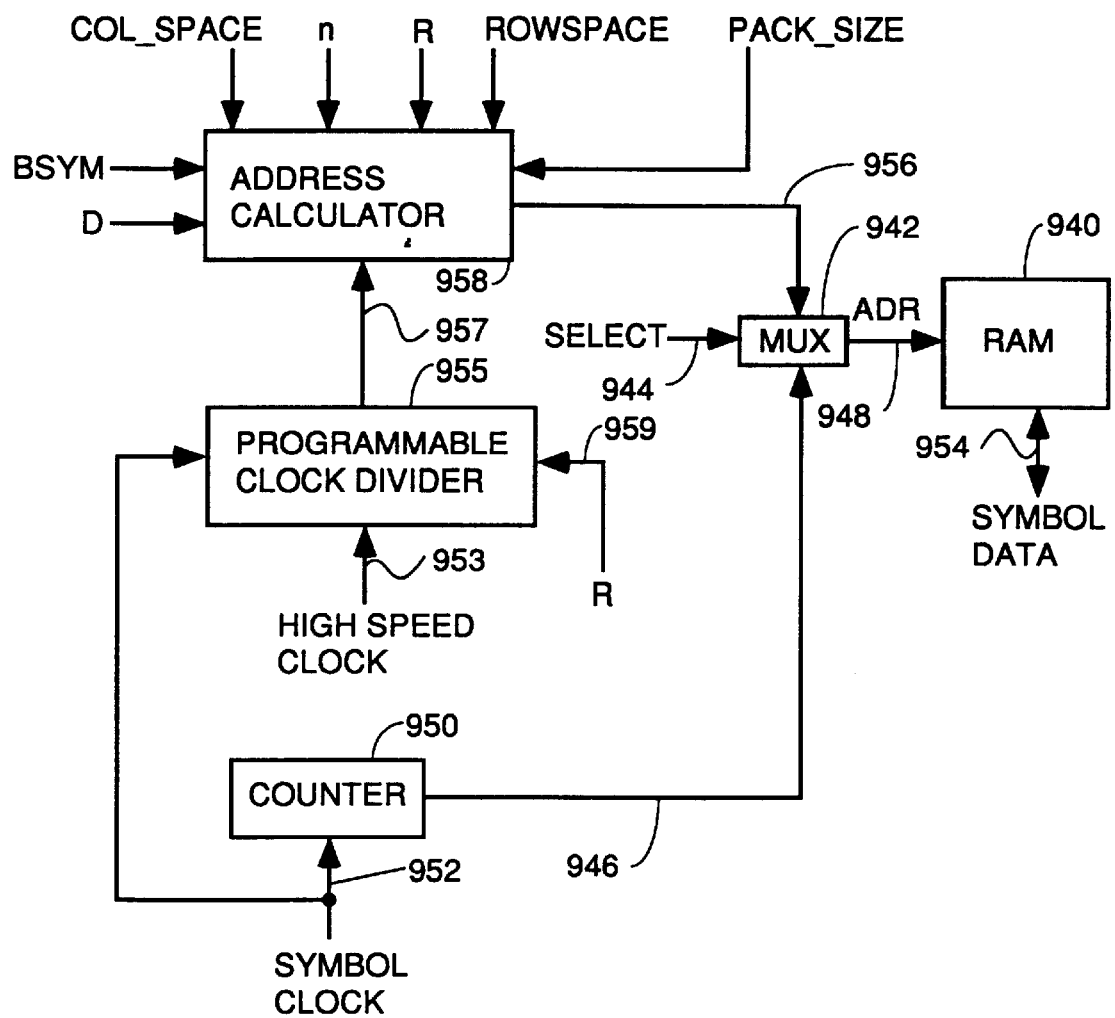
FIG. 9 is a block diagram of an apparatus for transmitting in an interleaving fashion the noninterleaved array of FIG. 3.

FIG. 9 is a block diagram of an apparatus for transmitting in an interleaved fashion the noninterleaved of FIG. 3 in a CDMA system where the number of codes R can vary from frame to frame. In the apparatus of FIG. 9, apparatus and signals having the same reference numbers as apparatus in FIG. 7 have the same structure and perform the same function except as specifically identified below. The overall function of the apparatus of FIG. 9 is, first, to store symbols from a linear array input on one-symbol-wide bus 954 sequentially in sequential storage locations in RAM 940 with each memory location storing After the symbols are stored, an array exists like that shown in FIG. 3 with the understanding that the number of codes R assigned on line 959 and the number of rows can vary over time.

To transmit the array of FIG. 3, interleaved addresses to control the reading of symbols must be generated at a rate of R per symbol time. This is done by address calculator 958 in combination with programmable clock divider 955. The clock divider receives the code assignment number R on line 959 and the high speed clock signal on line 953. The symbol clock signal is fed to the programmable clock divider on line 952 to keep the divided down clock signal on line 957 phase coherent with the symbol clock signal. The programmable clock divides the high speed clock signal on line 953 down by a factor R to generate a clock signal on line 957 which has R clock periods for every clock period of the symbol clock signal on line 952. The address calculation circuit receives a symbol index number n which is the index of the first symbol in the group or packet of symbols to be interleaved. That number n is set into a counter (not shown) which is incremented by the clock signal on line 957. The value of the counter is used as index n in the equations of either method 1 or method 2 along with other appropriate ones of the inputs to calculate the values of i an values are used to generate R interleaved RAM addresses on bus 956 for every period of the symbol clock on line 952. These addresses are used to read out R symbols from interleaved locations in RAM 940 for every period of the symbol clock. These symbols are output as a serial data stream on bus 954 and sent to the spreading code circuitry (not shown).

To transmit the symbols of the minislot of FIG. 2B in an interleaved fashion, it is easiest to store the 28 symbols from the minislot in an interleaved fashion like that shown in FIG. 4, and then transmit the memory locations in RAM 940 sequentially in the manner described above.

To store the symbols of the minislot of FIG. 2B in an interleaved fashion, the select control signal on line 944 would be controlled to select the address output on line 956 output by address calculation circuit 958 for application to the address bus 948. The address calculation circuit could be any digital computer, gate array, PAL, state machine etc. that is capable of making the calculations of either the method 1 or method 2 algorithm described below and generating RAM addresses on line 956 from the i and j results of the calculation. The address calculation circuit is also shown as having multiple inputs upon which are received the various parameters needed in the calculation of the equations given below for method 1 or method 2. Not all the parameters shown are needed for method 1 and not all the parameters shown are needed for method 2. Depending upon the method selected, assume that only the necessary parameters are supplied that are needed in the equations given below for the selected method. Likewise, the parameters may be stored in either volatile or nonvolatile memory inside address calculator circuit 958 so the inputs shown may not be needed in some embodiments. In the preferred embodiments, each of these parameters is programmable, but in some embodiments, some or all of the parameters may be fixed.

The method 1 algorithm described below only interleaves the data based upon a given vertical distance, D, i.e., a minimum number of indices between any pair of symbols within a column or between a given number of adjacent columns (Col_Space). Method 2 described below interleaves the data based upon a given vertical distance and upon a given horizontal distance (Hor_Dist), i.e., a minimum number of indices between any two symbols within a given row or between rows in a given number of adjacent rows (Row_Space).

The resulting array of stored symbols using the interleaving method 1 would look like the array of FIG. 4. Each memory location in RAM 940 would store a symbol. The symbols in the array of FIG. 4 are represented by their index value. If the first symbol in a minislot has index 1, and the next symbol in the minislot has index 2, and there are 28 symbols in a minislot, then the array of FIG. 4 represents how the 28 minislots would be interleaved using method 1 assuming 4 codes were assigned to spread the data from this minislot, a Col_Space of 2 and a vertical distance, D, of 3. The Col_Space is a design parameter in the form of a programmable number representing the expected time duration expressed as a number of columns, i.e., symbol transmission times, of the expected burst noise. The vertical distance, D, is a design parameter in the form of a programmable number representing the minimum number of indices separating any two symbols within a column or between any two columns of the Col_Space. Note in the array of FIG. 4 that in column 1, no symbol is closer than 3 indices from any other symbol.

The array of FIG. 4 would be transmitted in exactly the same fashion as described above (simultaneous readout of 4 sequential addresses at a time, each address containing one symbol from the array of FIG. 4), but the interleaving of symbols would make it less susceptible to error caused by burst noise or intercode interference or both, depending upon the method of interleaving implemented in address calculation circuit 958.

Extension of the interleaving process to a packet of symbols comprising more than one minislot and to more than or fewer than 4 codes is a straightforward extension of the process described above using RAM addresses generated from the calculations of i and j from the equations given below for either method 1 or method 2.

Figure 5:
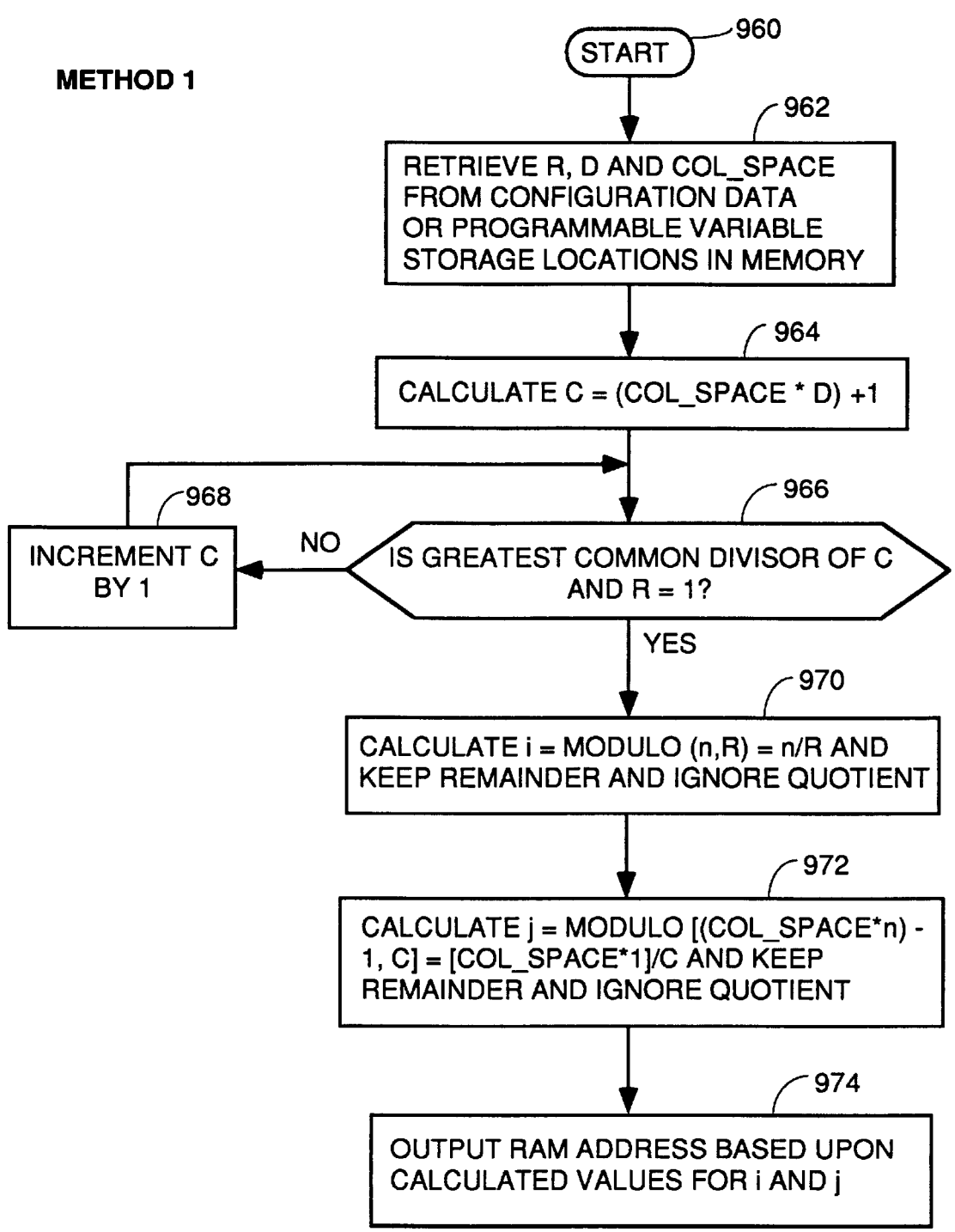
FIG. 5 is a flowchart of the process of interleaving method 1.

The address calculation circuit 958 in FIG. 2A would have to perform the calculations symbolized by the flowchart of FIG. 5 to implement method 1 interleaving. In FIG. 5, block 960 represents the start of the process, and block 962 represents the process of retrieving the programmable constants the control the interleaving process. Specifically, block 962 represents the process of retrieving the value R representing the number of codes assigned to spread the data from the packet or minislot to be transmitted. Block 962 also retrieves the value of D, the programmable value of the desired vertical distance for the degree of interleaving. Finally, step 962 also represents the process of retrieving the programmable value of Col_Space, the expected number of columns or symbol times that burst noise during which transmission of symbol data will be corrupted. The constants are all integers and are retrieved from configuration data or other memory where programmable variables are stored. Typically, in a system employing the teachings of the invention, these variables will be altered with changing conditions on the media in response to changing error rates.

Block 964 represents the process of calculating a value C which represents the number of columns in the interleaved matrix. The equation for C is:

$$C = (Col\_Space * D) + 1 \qquad (1)$$

where Col_Space and D are as defined above with Col_Space also being the period of time expressed in an integer number of columns during which the "vertical distance", D, must be satisfied. D can also be expressed as the minimum amount of "space", i.e., symbol indices, between any two symbols in a string of symbols having a length equal to Col_Space * R. Thus, if Col_Space is 2 and 4 codes have been assigned as R for spreading data, in every group of 8 symbols transmitted from any two adjacent columns each having 4 codes or rows, no symbol of those 8 symbols will be closer than D indices to any other symbol in that group of 8. Block 964 of FIG. 5 represents the process of calculating the value for C. In the case of the interleaved matrix shown in FIG. 4 where D=3 and Col_Space=2, the number of columns in the interleaved matrix used to interleave the 28 symbols of the minislot is 7. The number of rows R in the matrix of FIG. 4 is an assigned and programmable number corresponding to the number of codes assigned to spread the data from the minislot. This code assignment is usually sent downstream from the head end controller or CU to the RU as a management and control message.

There is a constraint on C and R, and this constraint is tested to make sure it is satisfied by test 966 in FIG. 5. That constraint is:

$$GCD(C,R)=1 \quad (2)$$

meaning the greatest common divisor of C and R must be 1. This test is carried out using a known algorithm invented by Euclid and is implemented in various math lab programs currently commercially available. If block 966 determines that the greatest common divisor between C and R is not equal to 1, then step 968 is performed to increment the value of C by 1, and test 966 is then performed again.

If test 966 determines that the greatest common divisor between C and R is 1, then the process of block 970 is performed. The function of block 970 is to calculate a value for a RAM index i which will be used to form a RAM address with i being calculated for each symbol as a function of the index, n, of that symbol. In each RU, a symbol counter counts periods of a symbol clock. This symbol counter is set to the symbol index, n, of the first symbol to be transmitted in every group of symbols to be transmitted when interleaving is to begin and thereafter increments symbol index, n, on every period of the symbol clock. The output of the counter is supplied as the n input to the address calculator 958 in either FIG. 2A or 7, or is completely internal to this address calculator. The value for i is calculated from Equation (3) below.

$$i=\text{modulo}(n,R) \quad (3)$$

where n is the index of the particular symbol for which RAM index i is being calculated and R is the number of codes assigned for the transmission in which this symbol will be transmitted. The meaning of the term modulo(n,R) is that n will be divided by R and the remainder will be kept and the quotient will be ignored so that i equals the remainder of the division of n by R.

Next, in block 972 the process of calculating RAM index j for this same symbol as a function of the index n of the symbol is performed. The value of j is calculated in accordance with Equation (4) below.

$$j=\text{modulo}[(\text{Col\_Space}*n)-1, C] \quad (4)$$

where Col_Space is as defined above, n is the index of the symbol and C is the number of columns in the array generated for the values of Col_Space and "vertical distance", d, selected. The meaning of this equation is that j equals the remainder of division of a numerator equal to the quantity the product of Col_Space times index n minus 1 by a denominator equal to C, ignoring the quotient.

Finally, in step 974, the address calculator that is carrying out the steps of FIG. 5 generates a RAM address on bus 956 for RAM 940 based upon the values of i and j, and stores the symbol on bus 954 having the index n which caused these values i and j to be generated. That completes the process of storing one symbol. For the remaining symbols of the array, n is incremented, and steps 970, 972 and 974 are repeated and this process is repeated until all symbols are stored.

Figure 6:
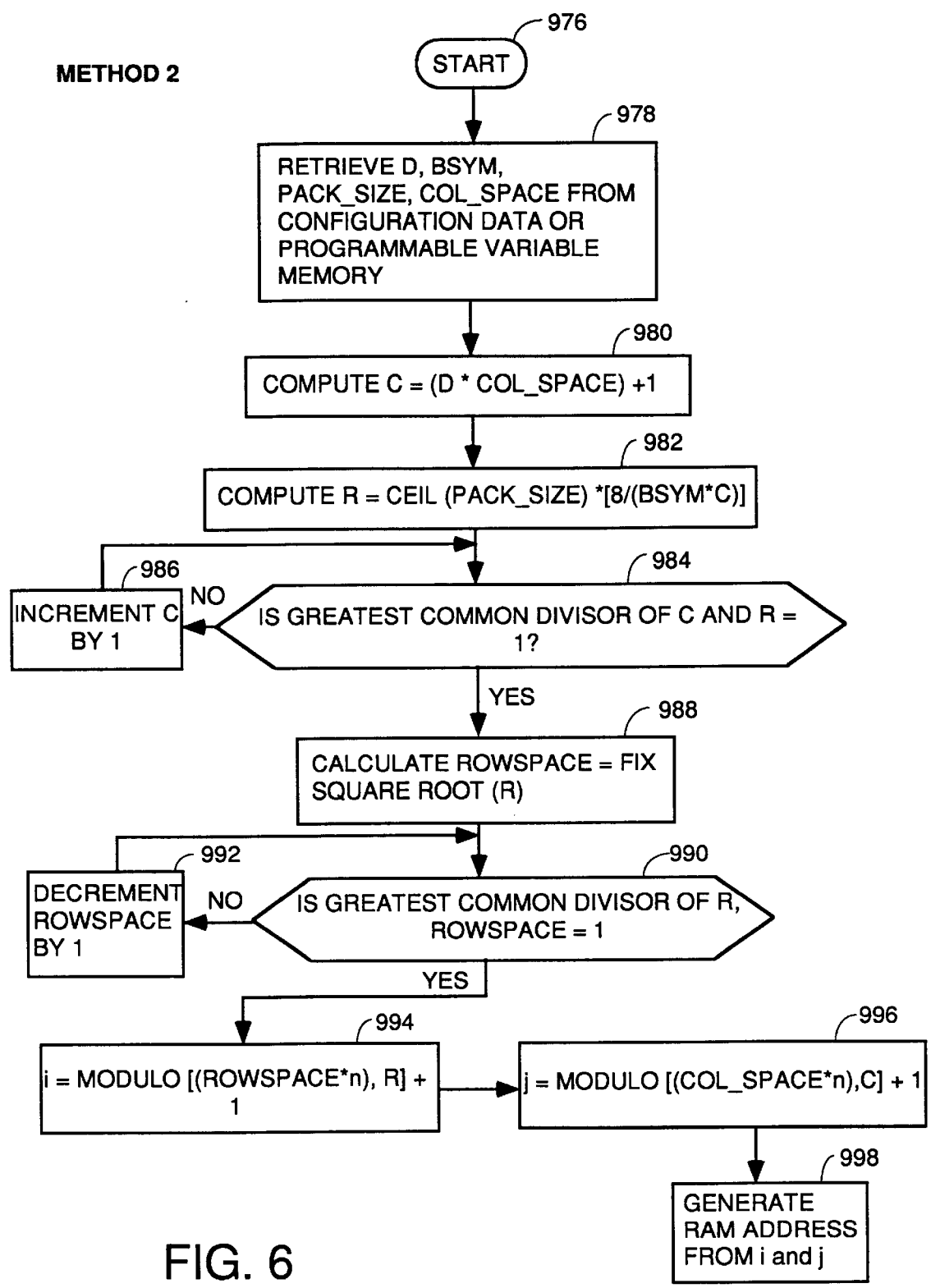
FIG. 6 is a flowchart of the process of interleaving method 2.

The manner of interleaving using method 2 is symbolized by the flowchart of FIG. 6. In this interleaving process, both burst noise and intercode interference effects can be spread out so as to not exceed the error detection and correction capability of the ECC bits added to the stream of data, whereas method 1 of FIG. 5 only minimized the effects of burst noise. In method 2, there is a factor ROWSPACE which corresponds to the same sort of notion as Col_Space but is the number of adjacent codes which are expected to be affected by intercode interference. However, in method 2, the value of ROWSPACE is a number calculated by the interleaving system whereas in method 1, the value of Col_Space is a programmable number which is a design parameter which is given to the interleaving system. The resulting interleaving will insure that no pair of symbol indices in the array within any row within the ROWSPACE or between rows on the rowspace will be closer than a programmable factor Hor_Dist closer to each other. The interleaving of method 2 also insures that in the interleaved array, no pair of symbol indices within the programmable number of columns defined by Col_Space will be closer than the "vertical distance", d, to each other within any column of the Col_Space or between columns.

The process of method 2 starts with block 976. In block 978, the various factors needed for the calculation are retrieved from memory. The factors needed are Vert_Dist or D (these two terms are interchangeable), bsym, Pack$_{13}$ Size and Col_Space. These factors are retrieved from configuration memory or from a programmable variable memory. The factor Vert_Dist or D is a design parameter that is picked and which defines the minimum desired spacing between indices of any pair of symbols within any of the columns or between adjacent columns in any Col_Space. The factor bsym is the number of bits per symbol. The factor Pack_Size is the total number of bytes in a packet to be sent including the header. The factor Col_Space is a previously defined for method 1.

Block 980 computes the number of columns C that will be included in the final interleaved array. C in method 2 is equal to:

$$C=(\text{Vert\_Dist}*\text{Col\_Space})+1 \quad (5)$$

here Vert_Dist and Col_Space are as previously defined in the preceding paragraph.

Block 982 is performed next to calculate the number of rows and codes needed for the interleaved matrix. Note that method 2 requires the number of codes to be calculated to optimize the efficiency of use of the available bandwidth. The calculated number of rows resulting from the calculation of block 982 will be the minimum number of rows needed to transmit the amount of data to be interleaved from the packet to be sent. The number of codes that are needed is calculated as follows:

$$R = ceil\left[\text{Pack\_Size} * \left(\frac{8}{bsym * C}\right)\right] \quad (6)$$

where,

Pack_Size=the total number of bytes in a packet to be sent including the header;

C=the total number of columns in the array as calculated in Equation (5); and bsym=the number of bits in a symbol and varies with the type of modulation currently in use. The mathematical operator ceil operating on the expression in brackets means that any fractional part resulting from the evaluation of the expression in brackets is discarded by selecting the next largest integer regardless of whether the fractional amount is more or less than 0.5.

Note that this calculated number of codes places constraints on the code allocation. Since the total number of available codes is fixed and the CU or headend controller is responsible for assigning codes to the RUs, in some embodiments, the calculation of block 982 will done in the headend and sent downstream as a response to a bandwidth request sent upstream from the RU. In these embodiments, the CU or headend controller can also monitor the error rate in general or specifically as to a particular RU and send downstream messages telling all the RUs or specific ones thereof to change their modulation type to a different type that corresponds to the number of bits in the bsym factor used to calculate the number of rows or codes to be allocated to a particular RU. The CU will make such a calculation for each RU and then arbitrate between the numbers of codes calculated for each RU to make the final decisions as to which RU gets its calculated amount of codes and then send downstream messages to the RUs giving their code awards and modulation types to use. Normally, the factor Pack_Size will be fixed for a particular application but can vary from one type application or delivered service to another.

In other embodiments, the calculation of block 982 will be performed in the RU and sent in an upstream request for bandwidth to the CU with a message to the effect, "Please give me R codes or give me nothing until R codes can be awarded."

After the computation of R, test 984 is performed to determine if the greatest common divisor of C and R is equal to 1. If it is not, C is incremented by 1 in block 986 and test 984 is performed again.

If the greatest common divisor of C and R is equal to 1, the process of block 988 is performed to calculate a value for ROWSPACE as a function of the number of codes R to be used to transmit the data. The value of ROWSPACE is calculated per Equation (7) below.

$$\text{ROWSPACE}=fix(\sqrt{R}) \quad (7)$$

where ROWSPACE=the integer number of codes or rows that could be suffer derogation from intercode interference caused by imperfections in the frame alignment of the system. The notation $fix(\sqrt{R})$ means that ROWSPACE is the integer part of the $\sqrt{R}$.

After ROWSPACE is calculated, the test of block 990 is performed to determine if the greatest common divisor of R and ROWSPACE is or is not equal to 1. If not, ROWSPACE is decremented by 1 in the process of block 992, and the test of block 990 is performed again.

Once a value for ROWSPACE and R is obtained which have a greatest common divisor of 1, the RAM index i is calculated as a function of the ROWSPACE, R and the index of the particular symbol to be stored or read in accordance with Equation (8), as symbolized by block 994.

$$i=modulo[(\text{ROWSPACE}*n), R]+1 \quad (8)$$

where n is the index of the symbol to be stored or read and R is the number of codes or rows in the array. Equation (8) means that i=1 plus the remainder resulting from the division $$\frac{ROWSPACE*n}{R}$$

with the quotient ignored. This value of i is used to form part of the RAM address to either store the symbol having index n in RAM 940 or to read that symbol from the RAM.

Next, in block 996, the RAM index j is calculated as a function of Col_Space, n and C in accordance with Equation (9) below.

$$j=modulo[(\text{Col\_Space}*n), C]+1 \quad (9)$$

where

Col_Space=the integer number of columns that may be corrupted by burst noise and is a programmable design parameter, n=the index of the symbol to be stored or read, and C=the number of columns in the matrix. Equation (9) means that the value j is equal to 1 plus the remainder of the Finally, in step 998, the RAM address is generated from i and j and used to store the symbol or read it for transmission. fraction $$\frac{Col\_Space*n}{C}$$

with the quotient ignored.

The calculations of FIG. 6 only calculate i and j for one symbol. To calculate the i and j values for the rest of the symbols in the packet, steps 994, 996 and 998 are repeated for every other symbol using its index, n.

The resulting interleaved array using method 2 is shown in FIG. 8. The design parameters for the interleaving of FIG. 8 were Vert_Dist=3, Col_Space=2, Pack_Size=54 and bsym=5. From those parameters, the method 2 algorithm executed by the address calculation circuit calculates a number of columns, C=7, a number of rows or codes R=13, a ROWSPACE of 3 and a horizontal distance, Hor_Dist=4.

The above described methods of interleaving one dimensional arrays of symbols for transmission in an SCDMA or CDMA system having two degrees of freedom for multiplexing the shared data path, i.e., codes and time, yields a system with several advantages over TDMA systems. First, assuming the amount of needed bandwidth by all users of the CDMA system does not exceed the available codes, all users transmitting can transmit simultaneously with a constant bit rate. This means also that the amount of buffer memory they need is less in CDMA systems than in TDMA systems. This is because in a TDMA system, if a user desires to transmit at a constant bit rate, with only periodic or sporadic assignment of timeslots to that user, the user must have enough buffer memory to store all the bits output during the time when there was no timeslot to transmit them. Since buffer memory is expensive, the CDMA system can be less expensive than a TDMA system in terms of the amount of memory needed.

Although the invention has been described in terms of the two preferred methods and apparatus for implementing them, those skilled in the art will appreciate that numerous modifications or slight variations from that which is described are possible without departing from the true spirit of the teachings of the invention. All such modifications and variations are included within the scope of the claims appended hereto.

What is claimed is:

1. A method of programmably interleaving symbols from a one dimensional array in time of symbols, each symbol having an index n for storage in a two dimensional interleaved array of symbols which is interleaved both in time and across a plurality of spreading codes and stores symbols each having a RAM index i and a RAM index j, the values of said indexes i and j defining the position of each said symbol in said two dimensional array. comprising:

retrieving values for variables R, D and Col_Space from configuration data or a programmable variable storage memory, where R is a programmable variable equal to a number of spreading codes assigned to transmit symbol data which is also equal to the number of rows R in a two dimensional interleaved array of symbols to be transmitted, D is a programmable variable equal to a separation in symbol indices, n, between any two symbols within a column or between adjacent columns in a number of adjacent columns defined by Col_Space in said two dimensional interleaved array, and wherein Col_Space is a programmable variable equal to an integer number of adjacent columns which may be adversely affected by burst noise where each column in said two dimensional interleaved array contains a number of rows equal to R with one symbol in each row, and wherein each symbol encode a plurality of bits, and where said symbol indices, n, each correspond to a number designating a position of said symbol in a one dimensional array of symbols to be stored in interleaved fashion in said two dimensional interleaved array;

calculating a value C equal to a number of columns in said two dimensional interleaved array as follows:

C=(Col_Space*D)+1 determining if the greatest common divisor of C and R is equal to 1, and, if not, incrementing C by 1 and repeating the process of determining if the greatest common divisor of C and R is equal to 1, and, if not, incrementing C by 1 until the greatest common divisor of C and R is 1;

calculating a RAM index i for use in generating an address in RAM to use in storing a symbol with symbol index n into said two dimensional array by using the following equation i=modulo(n,R)

where n is the symbol index designating a position in said one dimensional array of a symbol to be stored in said two dimensional array;

calculating a RAM index j for use in generating an address in RAM to use in storing a symbol with symbol index n in said two dimensional array by using the following equation j=modulo[(Col_Space*n)−1, C];

generating a RAM address based upon i and j, and using said RAM address to store said symbol having index n in said two dimensional array.

2. A method of programmably interleaving symbols from a one dimensional array in time of symbols having index n to calculate RAM addresses for use in reading said symbols out of a two dimensional noninterleaved array of symbols, each symbol's position in said two dimensional array defined by the values of RAM indices i and j, such that the symbols transmitted are interleaved both in time and across a plurality of spreading codes, comprising:

retrieving values for variables R, D and Col_Space from configuration data or a programmable variable storage memory, where R is a programmable variable equal to a number of spreading codes assigned to transmit data, D is a programmable variable equal to a separation in symbol indices, n, between any two symbols within a column or between adjacent columns in a number of adjacent columns defined by Col_Space, and wherein Col_Space is a programmable variable equal to an integer number of adjacent columns which may be adversely affected by burst noise where each column in said noninterleaved array contains a number of rows equal to R with one symbol in each row, and where the symbol indices, n, each correspond to a number designating a position of said symbol in said one dimensional array;

calculating a value C equal to a number of columns in an interleaved array as follows:

C=(Col_Space*D)+1;

determining if the greatest common divisor of C and R is equal to 1, and, if not, incrementing C by 1 and repeating the process of determining if the greatest common divisor of C and R is equal to 1, and, if not, incrementing C by 1 until the greatest common divisor of C and R is 1;

calculating a RAM index i for use in generating an address in RAM to use in reading from RAM a symbol with symbol index n by using the following equation i=modulo(n,R)

where n is the symbol index designating a position in said one dimensional array of a symbol to be read;

calculating a RAM index j for use in generating an address in RAM to use in reading a symbol with symbol index n from RAM by using the following equation j=modulo[(Col_Space*n)−1, C], generating a RAM address based upon i and j, and using said RAM address to read said symbol having index n from RAM.

3. A method of programmably interleaving symbols from a one dimensional array in time of symbols having index n, each symbol encoding a plurality of data bits, for storage in a two dimensional interleaved array of symbols wherein the position in said two dimensional array of each symbol is defined by RAM indices i and interleaved in both time and across a plurality of spreading codes, comprising:

retrieving values for variables D or Vert_Dist, bsym, Pack_Size and Col_Space from configuration data or a programmable variable storage memory, where Vert_Dist or D is a programmable variable equal to a separation in symbol indices, n, between any two symbols to be transmitted within a column or between adjacent columns in a number of adjacent columns defined by Col_Space in a two dimensional interleaved array of symbols to be transmitted wherein each symbol has its position in said two dimensional array defined by the values of RAM indices i and j, and wherein Col_Space is a programmable variable equal to an integer number of adjacent columns of said two dimensional interleaved array which may be adversely affected by burst noise where each column in said two dimensional interleaved array contains a number of rows equal to R with one symbol in each row and wherein each symbol encodes a plurality of bits, and where bsym is equal to a number of bits encoded in each symbol, and where Pack_Size is a number of bytes in a packet of symbols to be transmitted including the header, and wherein symbol indices, n, each correspond to a numbered position of a symbol in a one dimensional array in time of symbols which are to be stored in interleaved fashion in said two dimensional interleaved array;

calculating a value C equal to a number of columns in an interleaved array as follows:

C=(Vert_Dist*Col_Space)+1;

calculating a number of codes R to use to spread the symbols in R rows of the interleaved array as follows $$R = ceil\left|\text{Pack\_Size} * \left(\frac{8}{bsym * C}\right)\right|$$

where the mathematical operator "ceil" operating on the expression in brackets means that any fractional amount resulting from the evaluation of the expression in brackets is discarded by selecting the next largest integer regardless of whether the fractional amount is more or less than 0.5 determining if the greatest common divisor of C and R is equal to 1, and, if not, incrementing C by 1 and repeating the process of determining if the greatest common divisor of C and R is equal to 1, and, if not, incrementing C by 1 until the greatest common divisor of C and R is 1;

calculating a ROWSPACE factor representing an integer number of adjacent rows in said interleaved array the codes of which could be adversely affected by intercode interference, ROWSPACE being calculated as follows ROWSPACE=fix($\sqrt{R}$)

where the notation fix($\sqrt{R}$) means that ROWSPACE is an integer part of $\sqrt{R}$;

determining if the greatest common divisor of R and ROWSPACE is equal to 1, and, if not, decrementing ROWSPACE by 1 and repeating the process of determining if the greatest common divisor of R and ROWSPACE is equal to 1, and if not, decrementing ROWSPACE by 1 until the greatest common divisor for R and ROWSPACE is 1;

calculating a RAM index i for use in generating an address in RAM to use in storing a symbol with symbol index n in RAM by using the following equation i=modulo[(ROWSPACE*n), R]+1 where n is the symbol index of designating a position in a one dimensional array of a symbol to be stored;

calculating a RAM index j for use in generating an address in RAM to use in storing a symbol with symbol index n in RAM by using the following equation j=modulo[(Col_Space*n)-1, C];

generating a RAM address based upon i and j, and using said RAM address to store said symbol having index n in RAM.

4. A method of programmably interleaving symbols from a one dimensional array in time of symbols, each symbol in said one dimensional array having its position established by the value of an index n to generate RAM addresses For reading said symbols in an interleaved fashion from a two dimensional noninterleaved array of symbols, each symbol in said two dimensional array having its position defined by the values of RAM indices i and j so that symbols transmitted are interleaved both in time and across a plurality of spreading codes, comprising:

retrieving values for variables D or Vert_Dist, bsym, Pack_Size and Col_Space from configuration data or a programmable variable storage memory, where Vert_Dist or D is a programmable variable equal to a separation in symbol indices, n, between any two symbols within a column or between adjacent columns in a number of adjacent columns defined by Col_Space in a two dimensional noninterleaved array of symbols to be transmitted wherein each symbol has its position in said two dimensional array defined by the values of RAM indices i and j, and wherein Col_Space is a programmable variable equal to an integer number of adjacent columns which may be adversely affected by burst noise and wherein each column in said noninterleaved array contains a number of rows equal to R with one symbol in each row and wherein each symbol encodes a plurality of bits, and where bsym is equal to a number of bits encoded in each symbol, and where Pack_Size is a number of bytes in a packet of symbols to be sent including a header, and where the symbol indices, n, each correspond to a numbered position of said symbol in a one dimensional array of symbols to be interleaved as they are read out from said noninterleaved two dimensional array for transmission;

calculating a value C equal to a number of columns in said noninterleaved two dimensional array as follows:

C=(Vert_Dist*Col_Space)+1, calculating a number of codes R to use to spread the symbols in R rows of said noninterleaved two dimensional array as follows $$R = ceil\left|\text{Pack\_Size} * \left(\frac{8}{bsym * C}\right)\right|$$

where the mathematical operator "ceil" operating on the expression in brackets means that any fractional part, that is any part of the result which is less than one, resulting from the evaluation of the expression in brackets is discarded by selecting the next largest integer regardless of whether said fractional part is more or less than 0.5 determining if the greatest common divisor of C and R is equal to 1, and, if not, incrementing C by 1 and repeating the process of determining if the greatest common divisor of C and R is equal to 1, and, if not, incrementing C by 1 until the greatest common divisor of C and R is 1;

calculating a ROWSPACE factor representing an integer number of adjacent rows in said interleaved array the codes of which could be adversely affected by intercede interference, ROWSPACE being calculated as follows $$ROWSPACE = \text{fix}(\sqrt{R})$$

where the notation $\text{fix}(\sqrt{R})$ means that ROWSPACE is an integer part of $\sqrt{R}$;

determining if the greatest common divisor of R and ROWSPACE is equal to 1, and, if not, decrementing ROWSPACE by 1 and repeating the process of determining if the greatest common divisor of R and ROWSPACE is equal to 1, and if not, decrementing ROWSPACE by 1 until the greatest common divisor for R and ROWSPACE is 1;

calculating a RAM index i for use in generating an address in RAM to use in reading a symbol with symbol index n from RAM by using the following equation $$i = \text{modulo}[(ROWSPACE*n), R] + 1$$

where n is the symbol index of designating a position in said one dimensional array of a symbol to be read;

calculating a RAM index j for use in generating an address in RAM to use in reading a symbol with symbol index n from RAM by using the following equation $$j = \text{modulo}[(Col\_Space*n), C] + 1,$$

generating a RAM address based upon i and j, and using said RAM address to read said symbol having index n from RAM.

5. A process comprising:

receiving a plurality of sequential symbols as a linear array for transmission on a code division multiplexed system, each position of each symbol in said linear array is designated by a symbol index;

storing said symbols in a two dimensional array having a plurality of columns and a plurality of rows, each column representing one symbol transmission time and each row of symbols being spread with a different spreading code and either interleaving said symbols by a programmable amount in time and by a programmable amount across a plurality of spreading codes either upon storage of said symbols in said two dimensional array or upon reading said symbols from said array for transmission; and transmitting all the symbols in a column of said two dimensional array simultaneously using spreading codes associated with each row to spread data of said symbols in each said row.

6. The process of claim 5 wherein said step of interleaving said symbols is done in such a manner that no two symbols within a column of an integer number of adjacent columns defined by a variable Col_Space or between said columns is closer together in symbol index than an integer number variable D.

7. The process of claim 5 wherein said step of interleaving said symbols is done in such a manner that no two symbols within a column of an integer number of adjacent columns equal to a variable Col_Space or between said columns is closer together in symbol index than an integer number variable D and is also done in such a way that no two symbols within a row of an integer number of adjacent rows equal to ROWSPACE or between said rows is closer together in symbol index than an integer number variable Hor_Dist.

8. An apparatus comprising:

an address calculating circuit having an input for receiving a symbol clock signal from a symbol clock and an output at which one or more RAM addresses appear during each period of said symbol dock, the times when said RAM addresses appear defining times when symbols are to be stored in a two dimensional array of symbols in RAM or times when symbols are to be read from a two dimensional array of symbols in RAM, said address calculating circuit functioning to calculate each said RAM address from calculated values of i and j each of which is a predetermined function of predetermined variables and/or calculated numbers in accordance with mathematical equations;

a counter having an input for receiving said symbol clock signal, and having an output at which RAM addresses appear;

a multiplexer having first and second address inputs coupled to said outputs of said address calculating circuit and said counter, respectively, for receiving RAM addresses from said address calculating circuit and said counter, and having an output at which RAM addresses appearing at a selected one of said inputs appears, and having an input at which a select signal appears which controls which of said inputs is coupled to said output; and a RAM having an address input coupled to said output of said multiplexer and having a data bus input/output port for receiving symbols to be stored at the addresses specified by RAM addresses supplied to said address input or at which symbols appear which have been read from said RAM from storage locations in said RAM specified by RAM addresses supplied to said address input.

9. An apparatus comprising:

an address calculating circuit having an input for receiving a symbol clock signal from a symbol clock, and an output at which one or more RAM addresses occur during each period of said symbol clock signal, the appearance of said RAM addresses defining times when a symbol is to be stored in a RAM memory, said address calculating circuit sequentially outputting a number of interleaved RAM addresses equal to a programmable variable R having a value equal to the number of a plurality of symbols stored in an interleaved array of symbols to be transmitted using a code division multiplexing transmitter during one period of said symbol clock;

a counter having an input for receiving a clock signal and having an output at which RAM addresses appear;

a programmable clock divider having an input for receiving a high speed clock signal and an input for receiving said symbol clock signal and an input for receiving a code assignment signal indicating how many codes R will be used to spread data of said plurality of symbols stored in said interleaved array to be transmitted and having an output at which a clock signal appears which is phase coherent with said symbol clock signal and which has R periods for every period of said symbol clock, said output coupled to said clock input of said counter;

a multiplexer having first and second address inputs coupled to said outputs of said address calculating circuit and said counter, respectively, and having an output at which the addresses appearing at a selected one of said inputs appears, and having an input at which a select signal appears which controls which of said inputs is coupled to said output; and a RAM having an address input coupled to said output of said multiplexer and having a data bus input/output port.

10. The apparatus of claim 9 wherein said address calculating circuit has a plurality of inputs at which a predetermined number of variables are received, and wherein the particular ones of said variables supplied to inputs of said address calculating circuit are determined by whether said address calculating circuit interleaves said symbols using a first or a second method of interleaving, said first method being a method for interleaving upon storage in a two dimensional interleaved array stored in said RAM of symbols to be transmitted said interleaving being over a Col_Space number of columns so as to achieve minimal separation of D between the resulting interleaved symbols stored in said two dimensional interleaved array measured in terms of symbol indices, and said second method being a method for interleaving upon storage in a two dimensional interleaved array stored in said RAM of symbols to be transmitted said interleaving carried out over a Col_Space number of columns so as to achieve minimal separation of D between interleaved symbols in said two dimensional array measured in terms of symbol indices, and interleaving over ROWSPACE number of rows of said two dimensional interleaved array stored in said RAM to achieve minimal separation of Hor_Dist between symbols in said two dimensional interleaved array stored in said RAM measured in terms of symbol indices, said inputs including for said first method values for variables R, D and Col_Space, where R is a programmable variable equal to the number of a plurality of spreading codes to be used to transmit said plurality of interleaved symbols stored in said two dimensional interleaved array, and where D is a minimum separation measured in terms of symbol indices within any group of Col_Space columns of said two dimensional interleaved array, and Col_Space is a programmable variable equal to an integer number of adjacent columns which may be adversely affected by burst noise where each column in said two dimensional interleaved array contains a number of rows equal to R with one symbol in each row, each symbol encoding a plurality of bits, and wherein said variables include for said second method values for variables D, bsym, Pack_Size and Col_Space where bsym equals the number of bits in each symbol and Pack_Size is a number of bytes in a packet of symbols to be sent including the header.

11. An apparatus comprising:
   an address calculating circuit having an input for receiving a clock signal which is phase coherent with a symbol clock signal generated by a symbol clock, said clock signal having R periods for every period of said symbol clock signal, and having an output at which RAM addresses appear during each period of said symbol clock signal, the appearance of each said RAM address defining a time when a symbol is to be read from a noninterleaved, two dimensional array of symbols to be transmitted, said symbols stored in RAM, said address calculating circuit sequentially outputting at said output R interleaved RAM addresses during every period of said symbol clock signal where R is equal to the number of a plurality of symbols to be read and transmitted from said noninterleaved, two-dimensional array during a single period of said symbol clock signal and transmitted using a code division multiplexing transmitter;
   a counter having an input for receiving said symbol clock clock signal and having an output at which RAM addresses appear at the rate of one RAM address per period of said symbol clock signal;
   a programmable clock divider having an input for receiving a high speed clock signal and an input for receiving said symbol clock signal, and an input for receiving a code assignment signal indicating how many codes R will be used to spread data of said plurality of symbols that are read from said noninterleaved, two-dimensional array using the R RAM addresses generated by said address calculating circuit during every period of said symbol clock signal, and having an output at which a clock signal appears which is phase coherent with said symbol clock signal and which has R periods for every period of said symbol clock signal, said clock signal at said output of said programmable clock divider being coupled to said clock input of said address calculating circuit;
   a multiplexer having first and second address inputs coupled to said output, of said address calculating circuit and said counter, respectively, and having an output at which RAM addresses appearing at a selected one of said inputs appears, and having an input at which a select signal appears which controls which of said inputs is coupled to said output; and
   a RAM having an address input coupled to said output of said multiplexer and having a data bus input/output port.

12. The apparatus of claim 11 wherein said address calculating circuit has a plurality of control inputs at which predetermined input variable signals are received, are received, and wherein the input variable signals that are received is determined by whether said address calculating circuit interleaves said RAM addresses to be used in reading symbols from said noninterleaved two dimensional array using a first or a second method of interleaving, said first method for interleaving RAM addresses to use in reading symbols from said noninterleaved two dimensional array over a Col_Space number of columns of said noninterleaved two dimensional array so as to achieve minimal separation of D between symbols read from said noninterleaved, two dimensional array measured in terms of symbol indices of symbols in said noninterleaved, two dimensional array, and said second method for interleaving RAM addresses to use in reading symbols from said noninterleaved, two dimensional array over a Col_Space number of columns to achieve minimal separation of D between symbols read from said noninterleaved, two dimensional array measured in terms of symbol indices of symbols in said noninterleaved, two dimensional array, and said second method for interleaving said RAM addresses to use in reading symbols from said noninterleaved, two dimensional array over ROWSPACE number of rows in said noninterleaved, two dimensional array to achieve minimal separation of Hor_Dist between symbols read from said noninterleaved, two dimensional array measured in terms of symbol indices of symbols in said noninterleaved, two dimensional array, said input variable signals applied to said control inputs of said address calculating circuit including, for said first method, values of R, D and Col_Space, where R is a programmable variable equal to a number of spreading codes to be used to transmit a plurality of interleaved symbols read using said RAM addresses from said noninterleaved, two dimensional array, and where D is a minimum separation expressed in terms of symbol indices within any group of Col_Space columns within said noninterleaved, two dimensional array, and Col_Space is an integer number of adjacent columns within said noninterleaved, two dimensional array which may be adversely affected by burst noise, and where each column in said noninterleaved, two dimensional array contains a number of rows equal to R with one symbol in each row, each symbol encoding a plurality of data bits, and wherein said input variable signals applied to said control Inputs include, for said second method, values for D, bsym, Pack_Size and Col_Space where bsym is equal to said number of data bits encoded in.

* * * * *